(12) United States Patent
Saito et al.

(10) Patent No.: US 9,957,411 B2
(45) Date of Patent: May 1, 2018

(54) UNDERFILL MATERIAL AND METHOD FOR MANUFACTURING SEMICONDUCTOR DEVICE USING THE SAME

(71) Applicant: DEXERIALS CORPORATION, Tokyo (JP)

(72) Inventors: Takayuki Saito, Tochigi (JP); Taichi Koyama, Tochigi (JP); Hironobu Moriyama, Tochigi (JP)

(73) Assignee: DEXERIALS CORPORATION, Tokyo (JP)

( * ) Notice: Subject to any disclaimer, the term of this patent is extended or adjusted under 35 U.S.C. 154(b) by 0 days. days.

(21) Appl. No.: 14/915,734

(22) PCT Filed: Sep. 10, 2014

(86) PCT No.: PCT/JP2014/073964
§ 371 (c)(1),
(2) Date: Mar. 1, 2016

(87) PCT Pub. No.: WO2015/037633
PCT Pub. Date: Mar. 19, 2015

(65) Prior Publication Data
US 2016/0194517 A1    Jul. 7, 2016

(30) Foreign Application Priority Data
Sep. 11, 2013 (JP) ................. 2013-188683

(51) Int. Cl.
*C09J 7/00* (2006.01)
*C09J 163/00* (2006.01)
(Continued)

(52) U.S. Cl.
CPC .......... *C09D 163/00* (2013.01); *C08G 59/42* (2013.01); *C09D 133/066* (2013.01); *C09J 133/04* (2013.01); *C09J 133/066* (2013.01); *C09J 163/08* (2013.01); *H01L 21/563* (2013.01); *H01L 21/6836* (2013.01); *H01L 23/293* (2013.01); *H01L 23/3142* (2013.01); *H01L 24/27* (2013.01); *H01L 24/29* (2013.01); *H01L 24/73* (2013.01); *H01L 24/81* (2013.01); *H01L 24/83* (2013.01); *H01L 24/13* (2013.01); *H01L 24/16* (2013.01); *H01L 24/32* (2013.01); *H01L 24/92* (2013.01); *H01L 24/94* (2013.01); *H01L 25/0657* (2013.01); *H01L 25/50* (2013.01); *H01L 2221/68327* (2013.01); *H01L 2221/68377* (2013.01); *H01L 2224/13025* (2013.01); *H01L 2224/13111* (2013.01); *H01L 2224/13147* (2013.01); *H01L 2224/16146* (2013.01); *H01L 2224/16227* (2013.01); *H01L 2224/16238* (2013.01); *H01L 2224/271* (2013.01); *H01L 2224/27003* (2013.01); *H01L 2224/2919* (2013.01); *H01L 2224/2929* (2013.01); *H01L 2224/29191* (2013.01); *H01L 2224/29291* (2013.01); *H01L 2224/29387* (2013.01); *H01L 2224/32145* (2013.01); *H01L 2224/32225* (2013.01); *H01L 2224/73104* (2013.01); *H01L 2224/81191* (2013.01); *H01L 2224/81204* (2013.01); *H01L 2224/81444* (2013.01); *H01L 2224/81815* (2013.01); *H01L 2224/83191* (2013.01); *H01L 2224/83204* (2013.01); *H01L 2224/83862* (2013.01); *H01L 2224/92* (2013.01); *H01L 2224/9211* (2013.01);
(Continued)

(58) Field of Classification Search
None
See application file for complete search history.

(56) References Cited

U.S. PATENT DOCUMENTS 8,582,198 B2 * 11/2013 Nishida .................... G02F 1/167
359/296
9,202,755 B2 * 12/2015 Moriyama .............. H01L 24/29
(Continued)

FOREIGN PATENT DOCUMENTS

JP        2000-306955 A    11/2000
JP        2005-028734 A     2/2005
(Continued)

OTHER PUBLICATIONS

Dec. 2, 2014 Written Opinion issued in International Patent Application No. PCT/JP2014/073964.
(Continued)

*Primary Examiner* — Michael J Feely
(74) *Attorney, Agent, or Firm* — Oliff PLC (57) ABSTRACT

An underfill material achieving a wide margin for mounting and a method for manufacturing a semiconductor device using the same are provided. The underfill material contains an epoxy resin, an acid anhydride, an acrylic resin, and an organic peroxide, wherein a minimum melt viscosity attainment temperature and a minimum melt viscosity obtained when melt viscosity of the underfill material is measured under a temperature increase rate condition in a range of 5 to 50° C./min are in a range of 100° C. to 150° C. and in a range of 100 to 5000 Pa·s, respectively. Since variation in the minimum melt viscosity attainment temperature measured under different temperature increase conditions is small, voidless mounting and good solder bonding properties can be achieved without strict control on the temperature profile during thermocompression bonding, and a wide margin for mounting can be achieved.

14 Claims, 6 Drawing Sheets

(51) Int. Cl.
  *C09J 133/08* (2006.01)
  *C09J 133/10* (2006.01)
  *C09D 163/00* (2006.01)
  *C09J 133/04* (2006.01)
  *C09J 163/08* (2006.01)
  *H01L 21/683* (2006.01)
  *H01L 23/29* (2006.01)
  *H01L 21/56* (2006.01)
  *C09D 133/06* (2006.01)
  *C09J 133/06* (2006.01)
  *H01L 23/31* (2006.01)
  *C08G 59/42* (2006.01)
  *H01L 23/00* (2006.01)
  *H01L 25/065* (2006.01)
  *H01L 25/00* (2006.01)

(52) U.S. Cl.
  CPC .. *H01L 2224/9212* (2013.01); *H01L 2224/94* (2013.01); *H01L 2225/06513* (2013.01); *H01L 2225/06517* (2013.01)

(56) References Cited

U.S. PATENT DOCUMENTS

| | | | | |
|---|---|---|---|---|
| 2001/0034382 A1* | 10/2001 | Sumita | ........... | C08G 59/188 523/466 |
| 2011/0006419 A1 | 1/2011 | Hirano | | |
| 2011/0237028 A1 | 9/2011 | Hamazaki et al. | | |
| 2011/0279546 A1* | 11/2011 | Kihara | ........... | B41J 2/14072 347/50 |
| 2015/0348858 A1* | 12/2015 | Koyama | ........... | C09J 133/04 438/126 |
| 2015/0348859 A1* | 12/2015 | Moriyama | ........ | C08G 59/18 438/126 |
| 2016/0017191 A1* | 1/2016 | Koyama | ........... | C09D 133/066 438/127 |

FOREIGN PATENT DOCUMENTS

| | | | |
|---|---|---|---|
| JP | 2009-239138 A | 10/2009 | |
| JP | 2010-226098 A | 10/2010 | |
| JP | 2011-243786 A | 12/2011 | |
| JP | 2012-124244 A | 6/2012 | |
| JP | 2013-123033 A | 6/2013 | |
| WO | WO 2013/146141 A1 * | 10/2013 | ............. H01L 21/60 |

OTHER PUBLICATIONS

Dec. 2, 2014 International Search Report issued in International Patent Application No. PCT/JP2014/073964.

Dec. 6, 2016 Japanese Notification of Reasons for Refusal issued in Japanese Patent Application No. 2013-188683.

* cited by examiner

UNDERFILL MATERIAL AND METHOD FOR MANUFACTURING SEMICONDUCTOR DEVICE USING THE SAME

TECHNICAL FIELD

The present invention relates to an underfill material used in mounting a semiconductor chip, and also to a method for manufacturing a semiconductor device using the same. This application claims priority to Japanese Patent Application No. 2013-188683 filed on Sep. 11, 2013, the entire content of which is hereby incorporated by reference.

BACKGROUND ART

In recent years, use of a "pre-applied underfill film (PUF)" that is an underfill film applied to electrodes of a semiconductor integrated circuit (IC) has been examined for the purpose of shortening processes in semiconductor chip mounting methods.

A mounting method using a pre-applied underfill film is carried out as follows, for example (see PLT 1, for example).

Step A: An underfill film is applied to a wafer, and the resulting wafer is diced into semiconductor chips.

Step B: A semiconductor chip with the underfill film applied thereto is positioned and mounted.

Step C: Thermocompression bonding is conducted on the semiconductor chip, so that electrical conduction is ensured through metallic bond of solder bumps and the semiconductor chip is bonded as a result of curing of the underfill film.

The viscosity of the underfill material lowers (liquefied) with temperature rise until reaction starts, and increases from a reaction starting point, and the underfill material turns into a hardened material. As a result of such changes in the viscosity, voids easily disappear; however, voids are likely to remain when the pressure is changed at wrong timings. In order to apply pressure in a timely manner, adjustment is typically made according to a mounting profile. Since an optimum condition is determined by the timing of pressure application and the viscosity of the underfill material, an optimum mounting condition needs to be found through actual mounting using chips.

Figure 10:
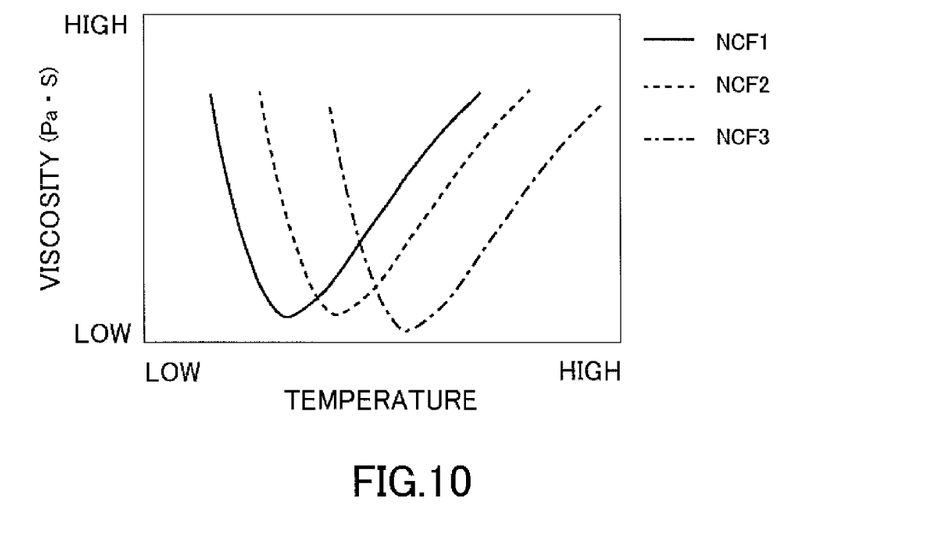
FIG. 10 is a graph showing examples of melt viscosity curves.

For examination of the above, data from a rheometer are typically used. For example, among melt viscosity curves shown in FIG. 10, NCF1 is suitable for mounting at low temperature in a short time, while NCF3 is suitable for mounting at a high temperature in a long time. Since, however, the temperature increase rate of the rheometer is greatly different from that in mounting, it is difficult to determine whether or not the curves are suitable for voidless mounting only from the rheometer data.

Since voidless mounting is affected by the shape and the heat conduction, among others, of actual packages, underfill materials that enable voidless mounting are likely to vary from one another. Furthermore, typically, an underfill material can achieve good mounting only with a predetermined mounting profile, which makes the margin for mounting narrow.

PRIOR ART LITERATURE

Patent Literature

PLT 1: Japanese Unexamined Patent Application Publication No. 2005-28734

SUMMARY OF THE INVENTION

Problem to be Solved by the Invention

The present invention is proposed in view of such circumstances of the related art, and provides an underfill material that achieves a wide margin for mounting and an a method for manufacturing a semiconductor device using the same.

Means for Solving the Problem

To solve the aforementioned problems, the present invention provides an underfill material to be pre-applied to a semiconductor chip having a solder-tipped electrode formed thereon before the semiconductor chip is mounted on an electronic component having a counter electrode facing the solder-tipped electrode, the underfill material containing an epoxy resin, an acid anhydride, an acrylic resin, and an organic peroxide, wherein a minimum melt viscosity attainment temperature and a minimum melt viscosity obtained when melt viscosity of the underfill material is measured under a temperature increase rate condition in a range of 5 to 50° C./min are in a range of 100° C. to 150° C. and in a range of 100 to 5000 Pa·s, respectively.

A method for manufacturing a semiconductor device according to the present invention, includes: a mounting step of mounting a semiconductor chip having a solder-tipped electrode formed thereon and an underfill material applied to a surface thereof having the solder-tipped electrode onto an electronic component having a counter electrode facing the solder-tipped electrode; and a thermocompression bonding step of conducting thermocompression bonding of the semiconductor chip and the electronic component, wherein the underfill material contains an epoxy resin, an acid anhydride, an acrylic resin, and an organic peroxide, and a minimum melt viscosity attainment temperature and a minimum melt viscosity obtained when melt viscosity of the underfill material is measured under a temperature increase rate condition in a range of 5 to 50° C./min are in a range of 100° C. to 150° C. and in a range of 100 to 5000 Pa·s, respectively.

Effects of the Invention

According to the present invention, since variation in the minimum melt viscosity attainment temperature measured under different temperature increase conditions is small, voidless mounting and good solder bonding properties can be achieved without strict control on the temperature profile during thermocompression bonding, and a wide margin for mounting can be achieved.

DESCRIPTION OF THE EMBODIMENTS

An embodiment of this invention will now be described in detail according to the following order.
1. Underfill Material
2. Method for Manufacturing Semiconductor Device
3. Examples

1. Underfill Material

An underfill material according to this embodiment is pre-applied to a semiconductor chip having solder-tipped electrodes formed thereon before the semiconductor chip is mounted on an electronic component on which counter electrodes to be opposite to the solder-tipped electrodes are formed.

Figure 1:
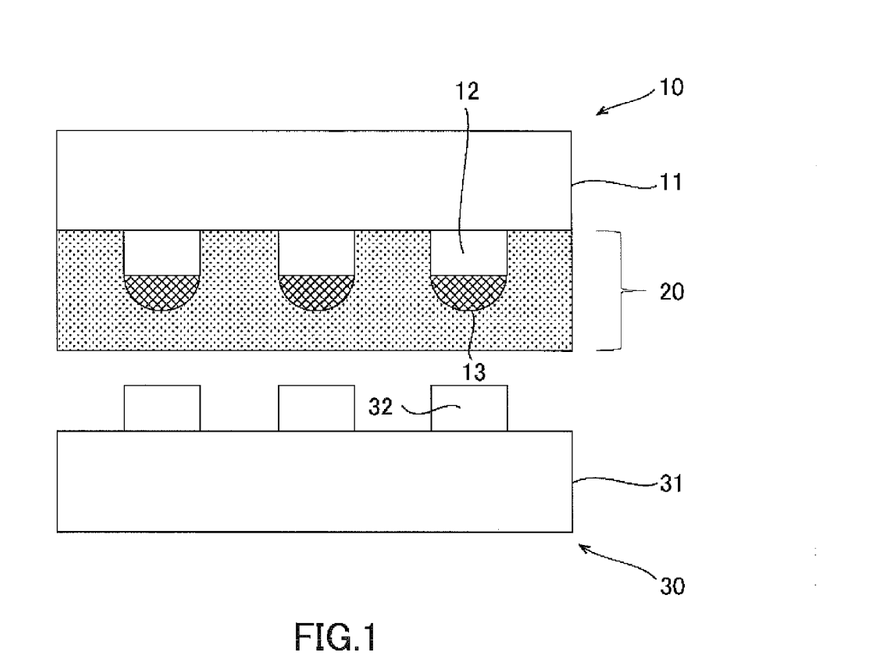
FIG. 1 is a cross-sectional view schematically illustrating a semiconductor chip before being mounted and a circuit substrate.
Figure 2:
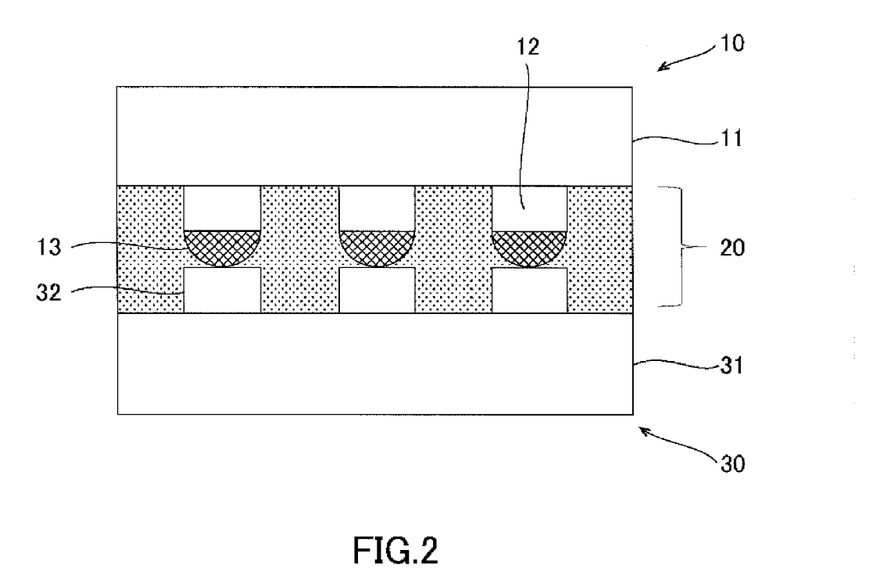
FIG. 2 is a cross-sectional view schematically illustrating the semiconductor chip after being mounted and the circuit substrate.
Figure 3:
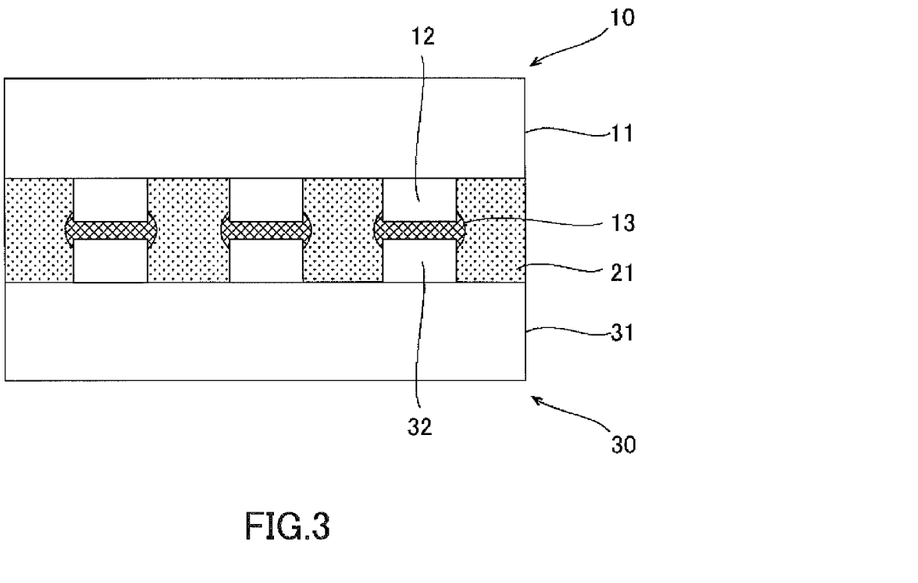
FIG. 3 is a cross-sectional view schematically illustrating the semiconductor chip and the circuit substrate subjected to thermocompression bonding.

FIG. 1 is a cross-sectional view schematically illustrating a semiconductor chip before being mounted and a circuit substrate, FIG. 2 is a cross-sectional view schematically illustrating the semiconductor chip after being mounted and the circuit substrate; and FIG. 3 is a cross-sectional view schematically illustrating the semiconductor chip and the circuit substrate subjected to thermocompression bonding.

As illustrated in FIGS. 1 to 3, an underfill material 20 in this embodiment is used in such a manner that the underfill material 20 is pre-applied to a surface, on which solder-tipped electrodes are formed, of a semiconductor chip 10, and the semiconductor chip 10 and a circuit substrate 30 on which counter electrodes being opposite to the solder-tipped electrodes are formed are bonded by an adhesive layer 21 resulting from curing of the underfill material 20.

The semiconductor chip 10 includes an integrated circuit formed on a surface of a semiconductor 11 made of such materials as silicon, and solder-tipped electrodes called bumps for connection. The solder-tipped electrodes are obtained by applying solder 13 onto electrodes 12 made of copper or the like, and each have a total thickness of the electrode 12 and the solder 13.

Examples of solder that can be used include Sn-37Pb eutectic solder (melting point: 183° C.), Sn—Bi solder (melting point: 139° C.), Sn-3.5Ag (melting point: 221° C.), Sn-3.0Ag-0.5Cu (melting point: 217° C.), and Sn-5.0Sb (melting point: 240° C.).

The circuit substrate 30 includes a substrate material 31 such as a rigid substrate and a flexible substrate, and a circuit formed thereon. A mounting part of the circuit substrate 30 on which the semiconductor chip 10 is to be mounted has formed thereon counter electrodes 32 having a predetermined thickness at positions corresponding to those of the solder-tipped electrodes of the semiconductor chip 10.

The underfill material 20 contains a film-forming resin, an epoxy resin, an acid anhydride, an acrylic resin, and an organic peroxide.

The film-forming resin corresponds to a high molecular weight resin having an average molecular weight of 10000 or higher, and in view of film forming properties, the average molecular weight is preferably in a range of about 10000 to 100000. Examples of film-forming resins that may be used include a variety of resins such as phenoxy resins, epoxy resins, modified epoxy resins, urethane resins, and acrylic rubber. These film-forming resin may be used individually or in a combination of two or more types. Among these, in view of film-formed state and connection reliability properties, a phenoxy resin is preferably used in this embodiment.

Examples of epoxy resins that may be used include dicyclopentadiene epoxy resins, glycidylether epoxy resins, glycidylamine epoxy resins, bisphenol A epoxy resins, bisphenol F epoxy resins, bisphenol S epoxy resins, epoxy resins having a spiro-ring, naphthalene epoxy resins, biphenyl epoxy resins, terpene epoxy resins, tetrabromobisphenol A epoxy resins, cresol novolac epoxy resins, phenol novolac epoxy resins, α-naphthalene novolac epoxy resins and brominated phenol novolac epoxy resins. These epoxy resins may be used individually or in a combination of two or more types. Among these, in view of high adhesiveness and heat resistance properties, a dicyclopentadiene epoxy resin is preferably used in this embodiment.

The acid anhydride has a flux function of removing an oxide film on a solder surface, and thus can provide excellent connection reliability. Examples of the acid anhydride include aliphatic acid anhydrides such as tetra propenyl succinic anhydride and dodecenyl succinic anhydride, alicyclic acid anhydrides such as hexahydro phthalic anhydride and methyl tetrahydro phthalic anhydride, and aromatic acid anhydrides such as phthalic anhydride, trimellitic anhydride and pyromellitic anhydride. These epoxy curing agents may be used individually or in a combination of two or more types. Among these epoxy curing agents, from the viewpoint of solder connectivity, an aliphatic acid anhydride is preferably used.

Furthermore, a curing accelerator is preferably added. Examples of the curing accelerator include imidazoles such as 2-methylimidazole, 2-ethylimidazole and 2-ethyl-4-methylimidazole, tertiary amines such as 1,8-Diazabicyclo[5.4.0]undec-7-ene (DBU) and 2-(dimethylaminomethyl)phenol, phosphines such as triphenylphosphine, and metallic compounds such as stannous octoate.

As the acrylic resin, monofunctional (meth)acrylate or polyfunctional (meth)acrylate may be used. Examples of monofunctional (meth)acrylates include methyl(meth)acrylate, ethyl(meth)acrylate, n-propyl(meth)acrylate, i-propyl (meth)acrylate, and n-butyl(meth)acrylate. Examples of polyfunctional (meth)acrylate include bisphenol F EO-modified di(meth)acrylate, bisphenol A EO-modified di(meth)acrylate, torimetirorlpropan PO-modified (meth)acrylate, and multifunctional urethane(meth)acrylate. These acrylic resins may be used individually or in a combination of two or more types. Among these, bifunctional (meth) acrylate is preferably used in this embodiment.

Examples of the organic peroxide include, peroxy ester, peroxy ketal, hydroperoxide, dialkyl peroxide, diacyl peroxide, and peroxydicarbonate. These organic peroxides may be used individually or in a combination of two or more types. Among these, peroxy ester is preferably used in this embodiment.

Furthermore, an inorganic filler is preferably contained as another additive composition. As a result of containing the inorganic filler, the fluidity of resin layers during pressure bonding can be regulated. Examples of inorganic fillers that can be used include silica, talc, titanium oxide, calcium carbonate, and magnesium oxide.

Moreover, an epoxy-based, amino-based, mercapto-sulfide-based, or ureide based silane coupling agent may be added as necessary.

As a result of using both an epoxy resin with relatively slow curing reaction and an acrylic resin with relatively rapid curing reaction as mentioned above, variation in the minimum melt viscosity attainment temperature measured under different temperature increase conditions can be made smaller, and a wide margin for mounting can be achieved.

Figure 4:
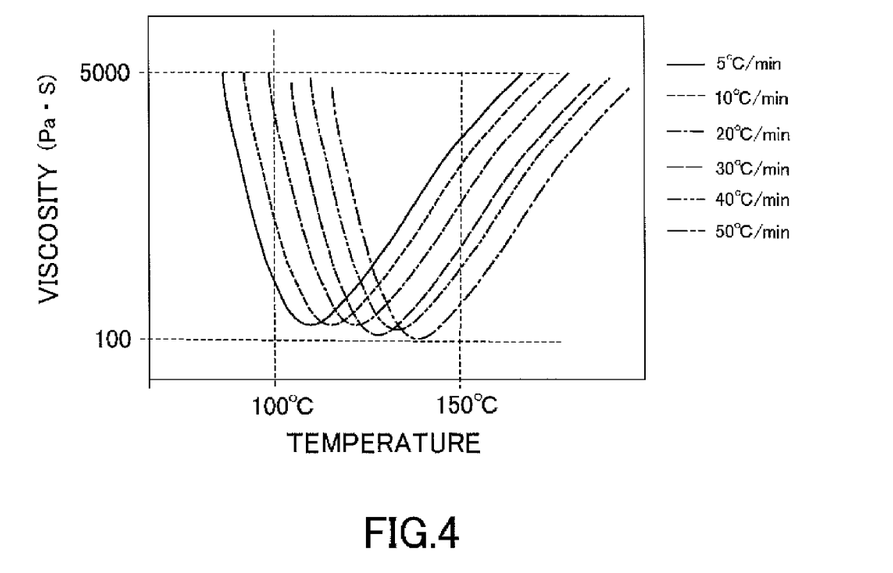
FIG. 4 is a graph showing melt viscosity curves at respective temperature increase conditions.

Specifically, as shown in FIG. 4, the minimum melt viscosity attainment temperature and the minimum melt viscosity when melt viscosity is measured under a temperature increase rate condition in a range of 5 to 50° C./min are in a range of 100 to 150° C. and in a range of 100 to 5000 Pa·s, respectively. This achieves voidless mounting and good solder bonding properties without strict control on the temperature profile during thermocompression bonding.

The minimum melt viscosity is preferably in a range of 1000 to 2000 Pa·s. This can prevent or reduce generation of voids during thermocompression bonding.

Furthermore, the ratio of the total mass of epoxy resin and acid anhydride to the total mass of acrylic resin and organic peroxide is preferably in a range of 7:3 to 4:6. This enables an underfill material that achieves voidless mounting and good solder bonding properties to be obtained.

Next, a method for manufacturing a pre-applied underfill film obtained by forming the underfill material described above into a film will be described. First, an adhesive agent composition containing a film-forming resin, an epoxy resin, an acid anhydride, an acrylic resin and an organic peroxide is dissolved in a solvent. Toluene and ethyl acetate, among others, or a mixture of these may be used as the solvent. The prepared resin composition is applied to a detachable substrate material with a bar coater or other applicator.

The detachable substrate material has a layered structure including a release agent such as silicone coating a PET (poly ethylene terephthalate), OPP (oriented polypropylene), PMP (poly-4-methylpentene-1), or PTFE (polytetrafluoroethylene) material, prevents the composition from drying, and maintains the shape of the composition.

Subsequently, the resin composition, having been applied to the detachable substrate material, is dried in an oven, by a heating and drying device, or the like. A pre-applied underfill film of a predetermined thickness can thus be obtained.

2. Method for Manufacturing Semiconductor Device

Next, a method for manufacturing a semiconductor device using the pre-applied underfill film described above will be described.

Figure 5:
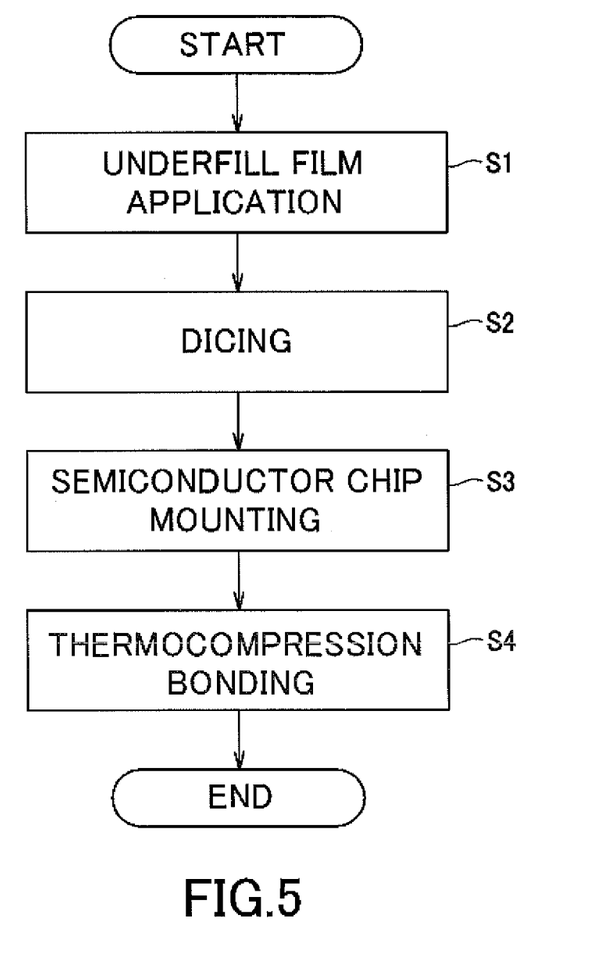
FIG. 5 is a flowchart illustrating a method for manufacturing a semiconductor device according to an embodiment.

FIG. 5 is a flowchart illustrating a method for manufacturing a semiconductor device according to this embodiment. As illustrated in FIG. 5, the method for manufacturing the semiconductor device according to this embodiment includes an underfill film application step S1, a dicing step S2, a semiconductor chip mounting step S3, and a thermocompression bonding step S4.

Figure 6:
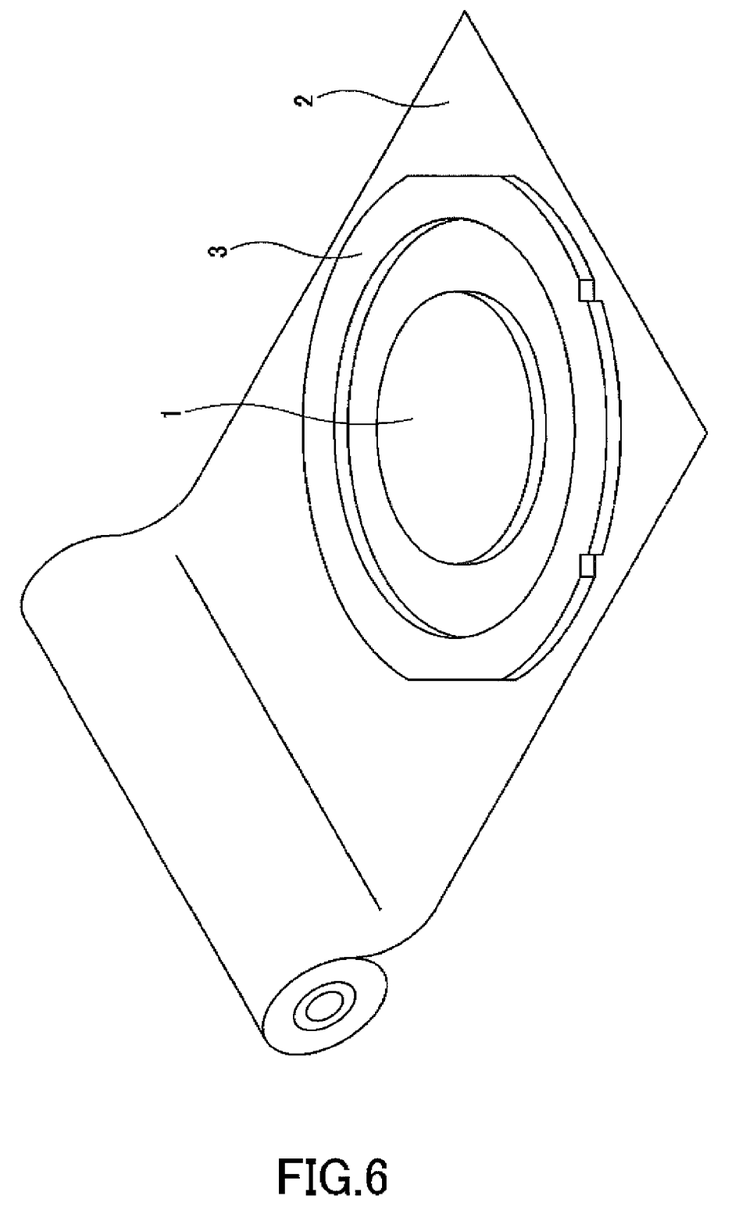
FIG. 6 is a perspective view schematically illustrating a step of applying an underfill film onto a wafer.

FIG. 6 is a schematic perspective view illustrating the step of applying an underfill film onto a wafer. As illustrated in FIG. 6, in the underfill film application step S1, a wafer 1 is secured by a jig 3 having a diameter larger than that of the wafer 1 and having a ring shaped or other enclosing shaped frame, and an underfill film 2 is applied onto the wafer 1.

The underfill film 2 protects and secures the wafer 1 during dicing and functions as a dicing tape that retains the wafer 1 during pick-up. A number of ICs (integrated circuits) are manufactured on the wafer 1; each of the semiconductor chips 10, demarked by scribe lines on the bonding side of the wafer 1, has a solder-tipped electrode(s) as shown in FIG. 1.

Figure 7:
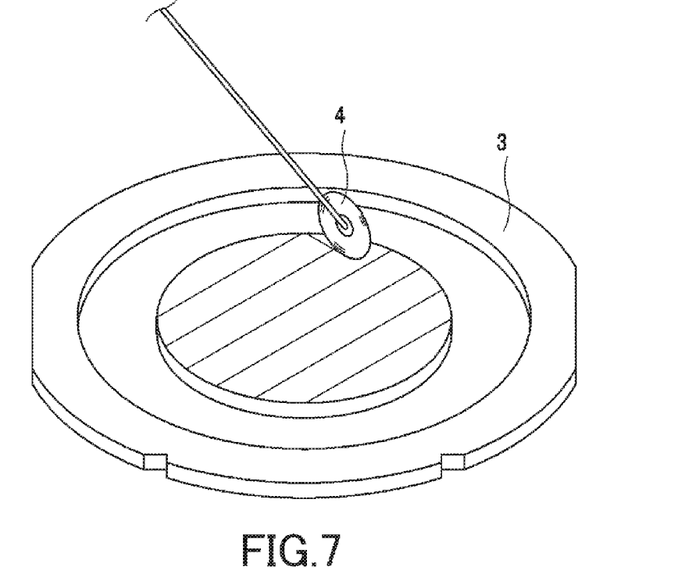
FIG. 7 is a perspective view schematically illustrating a step of dicing a wafer.

FIG. 7 is a schematic perspective view illustrating the wafer dicing step. As illustrated in FIG. 7, in the dicing step S2, a blade 4 is pressed along the scribe lines to cut the wafer 1, so that the individual semiconductor chips are separated.

Figure 8:
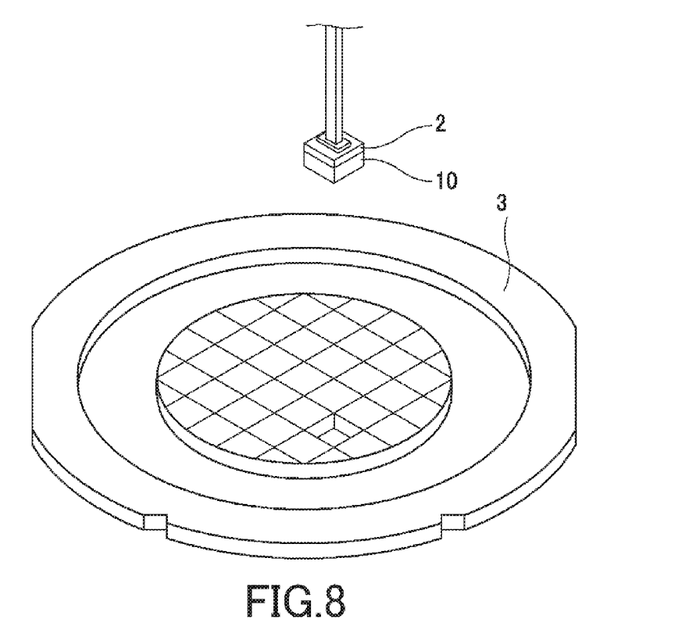
FIG. 8 is a perspective view schematically illustrating a step of picking up a semiconductor chip.

FIG. 8 is a schematic perspective view illustrating a semiconductor chip pick-up step. As illustrated in FIG. 8, each of the semiconductor chips 10, having the underfill film, is retained by the underfill film during the pick-up.

As illustrated in FIG. 2, in the semiconductor chip mounting step S3, the semiconductor chip 10 with the underfill film is mounted on the circuit substrate 30 in such a manner that the underfill film is placed therebetween. Additionally, the semiconductor chip 10 with underfill film is positioned so that the solder-tipped electrode is opposite to the counter electrode 32. Thermocompression bonding is performed by a thermal bonder under predetermined conditions of temperature, pressure, and duration such that the underfill film is made flowable but not completely cured, and mounting is performed.

The temperature condition during mounting is preferably in a range of 30 to 155° C. The pressure is preferably 50 N or less and more preferably 40 N or less. The duration is preferably in a range of 0.1 to 10 sec and more preferably in a range of 0.1 to 1.0 sec. Thus, the solder-tipped electrode(s) can contact the electrode(s) on the circuit substrate 30 without melting and the underfill film can be in a state of not being completely cured. Additionally, this fixation at a low temperature can prevent or reduce generation of voids and reduce damage to the semiconductor chip 10.

In the subsequent thermocompression bonding step S4, under a bonding condition of raising temperature at a predetermined rate from a first temperature to a second temperature, for example, the solder of the solder-tipped electrode is melted to form a metallic bond and the underfill film is completely cured.

In addition, a bonder head is kept at a certain height by the elasticity of resin until the temperature reaches the point at which the mounted underfill film starts to melt, and rapidly descends to a lowest position due to resin melting with temperature rise. The lowest position is determined by a relation between the descent speed of the bonder head and the resin curing speed. After further curing of the resin, the height of the bonder head is gradually increased due to thermal expansion of the resin and the bonder head.

The first temperature is preferably the same or nearly the same as the minimum melt viscosity attainment temperature of the underfill material and preferably in a range of 50 to 150° C. In this manner, the curing behavior of the underfill material can be made suitable to the bonding condition and generation of voids can be prevented or reduced. The rate of temperature rise is preferably in a range of 50 to 150° C./sec. The second temperature is preferably in a range of 200 to 280° C. and more preferably in a range of 220 to 260° C., depending on the type of solder. Under these conditions, a metallic bond is formed between the solder-tipped electrode and the substrate electrode, the underfill film is completely cured, and the electrodes of the semiconductor chip 10 are electrically and mechanically connected to the electrodes of the circuit substrate 30.

As described above, with the method for manufacturing the semiconductor device in this embodiment, the underfill material 20, which contains an epoxy resin, an acid anhydride, an acrylic resin, and an organic peroxide and whose minimum melt viscosity attainment temperature and whose minimum melt viscosity obtained by measuring the melt viscosity under a temperature increase rate condition in a range of 5 to 50° C./min is in a range of 100 to 150° C. and in a range of 100 to 5000 Pa·s, respectively, is pre-applied onto a semiconductor chip 10, on which a solder-tipped electrode has been formed; this can achieve voidless packaging (mounting) and good solder bonding properties without strict control on the temperature profile during thermocompression bonding.

While the underfill film functions as a dicing tape in the embodiment described above, the underfill film is not limited thereto and, alternatively, a dicing tape may be used for dicing and the underfill film may be used thereafter for flip-chip mounting.

Other Embodiments

The present technology can also be applied to the TSV (through-silicon via) technology in which small holes formed in a semiconductor chip are filled with metal to electrically connect multiple chip substrates layered in a sandwiched state.

The present technology can thus be applied to a method for manufacturing a semiconductor device having more than one chip substrate layers each having a first surface on which solder-tipped electrode are formed and a second surface, on a side opposite to the first surface, on which counter electrodes being opposite to the respective solder-tipped electrodes are formed.

In this case, with the underfill film applied to a first surface side of a first chip substrate, the first chip substrate is mounted on a second surface of a second chip substrate, the first surface of the first chip facing the second surface of the second chip. The first surface of the first chip substrate and the second surface of the second substrate are then thermally compressed at a temperature above the melting point of the solder of the solder-tipped electrodes, and a semiconductor device with more than one layer of chip substrates can thus be obtained.

Examples

3. Examples

Examples of the present invention will be described below. In these examples, pre-applied underfill films were manufactured, and melt viscosity was measured under a temperature increase rate condition in a range of 5 to 50° C./min. A package was then manufactured by connecting an IC chip having solder-tipped electrodes to an IC substrate having counter electrodes by using the underfill film, and voids and solder bonding thereof were evaluated. It should be noted that the present invention is not limited by these examples.

The melt viscosity measurement, the package manufacturing, the void evaluation, and the solder bonding evaluation were performed in the following manners.

Melt Viscosity Measurement

For each underfill film, the minimum melt viscosity and the minimum melt viscosity attainment temperature of samples were measured by a rheometer (ARES, TA Instruments) under a condition A of 5° C./min and 1 Hz, a condition B of 10° C./min and 1 Hz, a condition C of 20° C./min and 1 Hz, a condition D of 30° C./min and 1 Hz, a condition E of 40° C./min and 1 Hz, and a condition F of 50° C./min and 1 Hz.

Package Manufacturing

The underfill film was applied to a wafer by using a press machine under a condition of 50° C. and 0.5 MPa and the wafer was diced into IC chips having solder-tipped electrodes.

An IC chip had a size of 6×6 mm and a thickness of 200 μm, and had peripheral bumps (75 μm pitch, 384 pin) formed thereon each comprising a 20 μm-thick Cu electrode with a 16 μm-thick solder (Sn-3.5Ag, melting point: 221° C.) applied to the tip thereof.

Similarly, an IC substrate facing the IC chip had a size of 8×8 mm and a thickness of 100 μm, and had peripheral bumps (75 μm pitch, 384 pin) formed thereon, each comprising a 20 μm-thick Cu electrode plated with Ni/Au.

Subsequently, the IC chip was mounted onto the IC substrate by using a flip chip bonder under a condition of 60° C., 0.5 sec, and 30 N.

Subsequently, thermocompression bonding was conducted by using the flip chip bonder with temperature profiles 1 to 3 shown in FIG. 9. The temperature profile 1 refers to two-step pressure-bonding including pressure-bonding at a temperature increase rate of 150° C./sec from 60° C. to 150° C. and subsequent pressure-bonding at a temperature increase rate of 150° C./sec from 150° C. to 250° C. (under a constant load of 20 N). The temperature profile 2 refers to one-step pressure-bonding including pressure-bonding at a temperature increase rate of 150° C./sec from 60° C. to 250° C. (under a constant load of 20N). The temperature profile 3 refers to one-step pressure-bonding including pressure-bonding at a temperature increase rate of 50° C./sec from 60° C. to 250° C. (under a constant load of 20N).

After the thermocompression bonding, curing was further performed under a condition of 150° C. for 2 hours to obtain a package. It should be noted that the actual temperatures of the samples were measured with a thermocouple during use of the flip chip bonder.

Void Evaluation

Each of the packages obtained by the thermocompression bonding with the temperature profiles 1 to 3 was observed by using an SAT (Scanning Acoustic Tomography). Packages in which the area of voids was 5% or less of the total IC chip area were evaluated as "good" and those in which the voids area was more than 5% of the total IC chip area were evaluated as "bad". Typically, generation of voids is likely to have an adverse effect on long-term reliability.

Solder Bonding Evaluation

The resistance of each of the packages obtained by the thermocompression bonding with the temperature profiles 1 to 3 was measured. Packages having a resistance in a range 65 to 70Ω were evaluated as "good" and the others were evaluated as "bad".

Overall Evaluation

Cases where both of the void evaluation and the solder bonding evaluation were "good" were evaluated as "good" and the others were evaluated as "bad".

Example

As shown in Table 1, a resin composition for an underfill film was prepared by blending a phenoxy resin (PKHH, Union Carbide Corporation) at 13.7 pts. mass, an epoxy resin (HP7200H, DIC Corporation) at 15.1 pts. mass, an acid anhydride (MH-700, New Japan Chemical Co., Ltd.) at 8.9 pts. mass, an imidazole (2MZ-A, SHIKOKU CHEMICALS CORPORATION) at 0.1 pts. mass, an acrylic resin (DCP, Shin Nakamura Chemical Co., Ltd.) at 11.6 pts. mass, an initiator (PERBUTYL Z, NOF CORPORATION) at 0.6 pts. mass, a filler A (SO-E5, Admatechs Company Limited) at 44.5 pts. mass, and a filler B (AEROSIL RY200, NIPPON AEROSIL CO., LTD) at 5.5 pts. mass. This composition was applied to a PET (polyethylene terephthalate) material treated to be detachable by using a bar coater and dried in an oven of 80° C. for 3 min to manufacture the underfill film having a thickness of 50 μm (detachable cover PET (25 μm)/underfill film (50 μm)/detachable base PET (50 μm)).

Table 2 shows the minimum melt viscosity and the minimum melt viscosity attainment temperature measured at each temperature increase rate. The minimum melt viscosity and the minimum melt viscosity attainment temperature measured at 5° C./min were 1300 Pa·s and 100° C., respectively. The minimum melt viscosity and the minimum melt viscosity attainment temperature measured at 10° C./min were 1330 Pa·s and 105° C., respectively. The minimum melt viscosity and the minimum melt viscosity attainment temperature measured at 20° C./min were 1360 Pa·s and 110° C., respectively. The minimum melt viscosity and the minimum melt viscosity attainment temperature measured at 30° C./min were 1400 Pa·s and 114° C., respectively. The minimum melt viscosity and the minimum melt viscosity attainment temperature measured at 40° C./min were 1440 Pa·s and 123° C., respectively. The minimum melt viscosity and the minimum melt viscosity attainment temperature measured at 50° C./min were 1480 Pa·s and 130° C., respectively.

Table 3 shows the evaluation of voids and the evaluation of solder bonding of packages obtained with the temperature profiles 1 to 3. The ratio of voids to the total IC chip area of the package obtained with the temperature profile 1 was 0%, the resistance thereof was 68.5Ω, and the overall evaluation thereof was good. The ratio of voids to the total IC chip area of the package obtained with the temperature profile 2 was 0%, the resistance thereof was 68.2Ω, and the overall evaluation thereof was good. The ratio of voids to the total IC chip area of the package obtained with the temperature profile 3 was 0%, the resistance thereof was 68.1Ω, and the overall evaluation thereof was good.

Comparative Example

As shown in Table 1, a resin composition for an underfill film was prepared by blending a phenoxy resin (PKHH, Union Carbide Corporation) at 13.7 pts. mass, an epoxy resin (HP7200H, DIC Corporation) at 20.6 pts. mass, an acid anhydride (MH-700, New Japan Chemical Co., Ltd.) at 12.1 pts. mass, an imidazole (2MZ-A, SHIKOKU CHEMICALS CORPORATION) at 0.1 pts. mass, an acrylic resin (DCP, Shin Nakamura Chemical Co., Ltd.) at 3.3 pts. mass, an initiator (PERBUTYL Z, NOF CORPORATION) at 0.2 pts. mass, a filler A (SO-E5, Admatechs Company Limited) at 44.5 pts. mass, and a filler B (AEROSIL RY200, NIPPON AEROSIL CO., LTD) at 5.5 pts. mass. This composition was applied to a PET (polyethylene terephthalate) material treated to be detachable by using a bar coater and dried in an oven of 80° C. for 3 min to manufacture the underfill film having a thickness of 50 μm (detachable cover PET (25 μm)/underfill film (50 μm)/detachable base PET (50 μm)).

Table 2 shows the minimum melt viscosity and the minimum melt viscosity attainment temperature measured at each temperature increase rate. The minimum melt viscosity and the minimum melt viscosity attainment temperature measured at 5° C./min were 1300 Pa·s and 80° C., respectively. The minimum melt viscosity and the minimum melt viscosity attainment temperature measured at 10° C./min were 1350 Pa·s and 100° C., respectively. The minimum melt viscosity and the minimum melt viscosity attainment temperature measured at 20° C./min were 1400 Pa·s and 120° C., respectively. The minimum melt viscosity and the minimum melt viscosity attainment temperature measured at 30° C./min were 1450 Pa·s and 140° C., respectively. The minimum melt viscosity and the minimum melt viscosity attainment temperature measured at 40° C./min were 1500 Pa·s and 160° C., respectively. The minimum melt viscosity and the minimum melt viscosity attainment temperature measured at 50° C./min were 1550 Pa·s and 180° C., respectively.

In addition, Table 3 shows the evaluation of voids and the evaluation of solder bonding of packages obtained with the temperature profiles 1 to 3. The ratio of voids to the total IC chip area of the package obtained with the temperature profile 1 was 0%, the resistance thereof was open circuit, and the overall evaluation thereof was bad. The ratio of voids to the total IC chip area of the package obtained with the temperature profile 2 was 30%, the resistance thereof was 67.5Ω, and the overall evaluation thereof was bad. The ratio of voids to the total IC chip area of the package obtained with the temperature profile 3 was 10%, the resistance thereof was 69.2Ω, and the overall evaluation thereof was bad.

TABLE 1

| Category | Product Name | Example | Comparative Example |
|---|---|---|---|
| Film component | PKHH | 13.7 | 13.7 |
| Epoxy resin | HP7200 | 15.1 | 20.6 |
| Curing agent | Acid anhydride (MH-700) | 8.9 | 12.1 |
| Curing accelerator | Imidazole (2MZ-A) | 0.1 | 0.1 |
| Acrylic resin | DCP | 11.6 | 3.3 |
| Initiator | PERBUTYL Z | 0.6 | 0.2 |
| Filler | SO-E2 | 44.5 | 44.5 |
|  | AEROSIL RY200 | 5.5 | 5.5 |
| Total |  | 100 | 100 |

TABLE 2

| | | Temperature increase rate [° C./min] | | | | | |
|---|---|---|---|---|---|---|---|
| | | 5 | 10 | 20 | 30 | 40 | 50 |
| Example | Minimum melt viscosity [Pa · s] | 1300 | 1330 | 1360 | 1400 | 1440 | 1480 |
| | Minimum melt viscosity attainment temperature [° C.] | 100 | 105 | 110 | 114 | 123 | 130 |
| Comparative Example | Minimum melt viscosity [Pa · s] | 1300 | 1350 | 1400 | 1450 | 1500 | 1550 |
| | Minimum melt viscosity attainment temperature [° C.] | 80 | 100 | 120 | 140 | 160 | 180 |

TABLE 3

|  | Temperature profile 1 | | Temperature profile 2 | | Temperature profile 3 | |
| --- | --- | --- | --- | --- | --- | --- |
|  | Ex. | Com. | Ex. | Com. | Ex. | Com. |
| Ratio of voids to the total IC chip area [%] | 0 | 0 | 0 | 30 | 0 | 10 |
| Void evaluation | Good | Good | Good | Bad | Good | Bad |
| Resistance [Ω] | 68.5 | Unmeasurable | 68.2 | 67.5 | 68.1 | 69.2 |
| Solder bonding evaluation | Good | Bad | Good | Good | Good | Good |
| Overall evaluation | Good | Bad | Good | Bad | Good | Bad |

In the Comparative Example, since the minimum melt viscosity attainment temperature measured at 5° C./min was low while the minimum melt viscosity attainment temperatures measured at 40° C./min and 50° C./min were high, the change in the minimum melt viscosity attainment temperature change with respect to the change in the temperature increase rate is great, and therefore the Comparative Example cannot be applied to mounting with different temperature profiles. In contrast, in the Example, since the change in the minimum melt viscosity attainment temperature with respect to the change in the temperature increase rate is small, voidless mounting and good solder bonding properties were achieved without strict control on the temperature profile during thermocompression bonding, and a wide margin for mounting was achieved.

Figure 9:
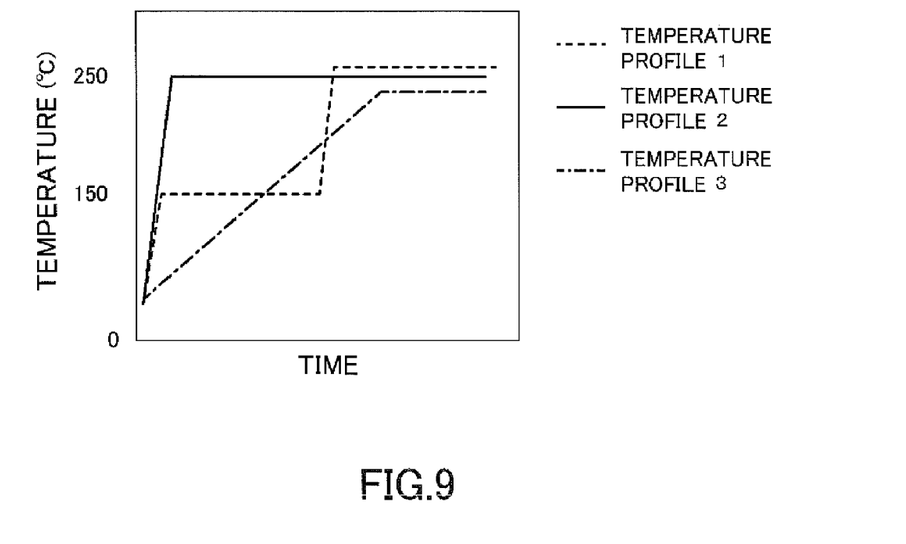
FIG. 9 is a graph showing temperature profiles in mounting.

EXPLANATION OF REFERENCES 1 wafer, 2 underfill film, 3 jig, 4 blade, 10 semiconductor chip, 11 semiconductor, 12 electrode, 13 solder, 20 underfill material, 21 first adhesive layer, 22 second adhesive layer, 30 circuit substrate, 31 substrate material, 32 counter electrode
FIG. 4
VISCOSITY (Pa·s)
TEMPERATURE
FIG. 5
START
S1 UNDERFILL FILM APPLICATION
S2 DICING
S3 SEMICONDUCTOR CHIP MOUNTING
S4 THERMOCOMPRESSION BONDING
END
FIG. 9
TEMPERATURE (° C.)
TIME
TEMPERATURE PROFILE 1
TEMPERATURE PROFILE 2
TEMPERATURE PROFILE 3
FIG. 10
VISCOSITY (Pa·s)
HIGH
LOW
TEMPERATURE
LOW
HIGH

The invention claimed is:

1. An underfill material to be pre-applied to a semiconductor chip having a solder-tipped electrode formed thereon before the semiconductor chip is mounted on an electronic component having a counter electrode facing the solder-tipped electrode, the underfill material containing a phenoxy resin, a dicyclopentadiene epoxy resin, an acid anhydride curing agent, an imidazole, a bifunctional (meth)acrylate having a cyclodecane skeleton, an organic peroxide, and a silica blend, the underfill material being in the form of a film, wherein
a ratio of a total mass of the dicyclopentadiene epoxy resin and the acid anhydride curing agent to a total mass of the bifunctional (meth)acrylate and organic peroxide is in a range of 7:3 to 4:6,
a minimum melt viscosity attainment temperature and a minimum melt viscosity obtained when melt viscosity of the underfill material is measured at all temperature increase rate conditions within the range of 5 to 50° C./min are in a range of 100 to 150° C. and in a range of 100 to 5000 Pa·s, respectively, and
a minimum melt viscosity attainment temperature and a minimum melt viscosity obtained when melt viscosity of the underfill material is measured under a temperature increase rate condition of 10° C./min are in a range of 100 to 110° C. and in a range of 100 to 5000 Pa·s, respectively.

2. The underfill material according to claim 1, wherein the minimum melt viscosity is in a range of 1000 to 2000 Pa·s.

3. The underfill material according to claim 2, wherein the curing agent is an aliphatic acid anhydride.

4. The underfill material according to claim 2, wherein the organic peroxide is a peroxy ester.

5. The underfill material according to claim 1, wherein the curing agent is an aliphatic acid anhydride.

6. The underfill material according to claim 5, wherein the organic peroxide is a peroxy ester.

7. The underfill material according to claim 1, wherein the organic peroxide is a peroxy ester.

8. An underfill material to be pre-applied to a semiconductor chip having a solder-tipped electrode formed thereon before the semiconductor chip is mounted on an electronic component having a counter electrode facing the solder-tipped electrode, the underfill material containing a phenoxy resin, a dicyclopentadiene epoxy resin, an acid anhydride curing agent, an imidazole, a bifunctional (meth)acrylate having a cyclodecane skeleton, an organic peroxide, and a silica blend, the underfill material being in the form of a film, wherein
a ratio of a total mass of the dicyclopentadiene epoxy resin and the acid anhydride curing agent to a total mass of the bifunctional (meth)acrylate and organic peroxide is in a range of 7:3 to 4:6,
a minimum melt viscosity attainment temperature and a minimum melt viscosity obtained when melt viscosity of the underfill material is measured at all temperature increase rate conditions in the range of 5 to 50° C./min are in a range of 100 to 150° C. and in a range of 100 to 5000 Pa·s, respectively.

9. The underfill material according to claim 8, wherein the minimum melt viscosity is in a range of 1000 to 2000 Pa·s.

10. The underfill material according to claim 9, wherein the curing agent is an aliphatic acid anhydride.

11. The underfill material according to claim 9, wherein the organic peroxide is a peroxy ester.

12. The underfill material according to claim 8, wherein the curing agent is an aliphatic acid anhydride.

13. The underfill material according to claim 12, wherein the organic peroxide is a peroxy ester.

14. The underfill material according to claim 8, wherein the organic peroxide is a peroxy ester.

* * * * *